United States Patent [19]

Sohma et al.

[11] 4,206,830

[45] Jun. 10, 1980

[54] VEHICLE SPEAKER SYSTEM PROVIDED WITH A PASSIVE RADIATOR

[75] Inventors: Hiroshi Sohma, Tokyo; Toshihiro Tanno, Tendo, both of Japan

[73] Assignee: Pioneer Electronic Corporation, Tokyo, Japan

[21] Appl. No.: 962,857

[22] Filed: Nov. 22, 1978

[30] Foreign Application Priority Data

Nov. 22, 1977 [JP] Japan .......................... 52-157102[U]

[51] Int. Cl.[2] ........................ G10K 10/00; H05K 5/00

[52] U.S. Cl. .................................... 181/141; 181/152; 181/154; 181/163; 181/199

[58] Field of Search ............... 181/141, 150, 152, 154, 181/155, 156, 159, 160, 163, 199, 144, 148

[56] References Cited

U.S. PATENT DOCUMENTS

| | | | |
|---|---|---|---|
| 1,930,577 | 10/1933 | Atkinson | 181/156 |
| 2,642,948 | 6/1953 | Olson et al. | 181/152 |
| 3,578,103 | 5/1971 | Lennes | 181/156 |
| 3,780,824 | 12/1973 | Prince | 181/144 |
| 3,993,345 | 11/1976 | Croup | 181/199 |

*Primary Examiner*—L. T. Hix

*Assistant Examiner*—Benjamin R. Fuller

*Attorney, Agent, or Firm*—Sughrue, Rothwell, Mion, Zinn and Macpeak

[57] ABSTRACT

Disclosed herein is a speaker system for mounting in a vehicle wherein a passive radiator is provided in the interior of the speaker system. The speaker system is mounted on the rear window tray or shelf of the vehicle so that the radiating surface of the passive radiator faces the rear glass window of the vehicle to thereby produce a horn effect. Due to the horn effect, the lower sound spectrum is fully reproduced.

8 Claims, 6 Drawing Figures

VEHICLE SPEAKER SYSTEM PROVIDED WITH A PASSIVE RADIATOR

BACKGROUND OF THE INVENTION

This invention relates to a speaker system provided with a passive radiator to be mounted in a vehicle. Such a speaker system is typically mounted on the rear window tray or shelf of an automobile. Modern automobiles are frequently equipped with stereo FM cassette players or other hi-fi sound systems. However, in view of space constraints large-full range speakers cannot be used. Hence, small speakers are employed with attendant deficiencies in frequency response.

In the case of a speaker cabinet in which a compact speaker unit is mounted, the reproduction of the lower sound spectrum tends generally to be deficient over the acoustic reproduction frequency range due to various restrictions of the cabinet design. Such speakers tend to sound "thin" because of a bias to reproduce high frequencies of the audio spectrum. In order to improve the deficiency of the lower sound spectrum, a passive radiator (or drone cone) type speaker system has been proposed. As shown in FIG. 1, a speaker unit B and a passive radiator C are provided in the same housing A. The passive radiator C does not have a magnetic circuit. The passive radiator C is adapted to resonate at frequencies lower than those reproduced in the speaker unit A, so that the reproduction range of the lower frequency spectrum can be broadened. The resonance of the passive radiator C takes place via air in the same phase as the speaker unit B.

Referring again to the speaker system of the type mounted on the rear window tray or shelf of the automobile, the size of the speaker cabinet and the speaker unit are restricted due to the area of the mounting place of the automobile. Modern automobiles generally have sloping rear windows and narrow rear shelves or trays. For most cases, the available speaker system is such that the volume of the speaker cabinet is at most about 3 liters. In such a size, the passive radiator type speaker system is preferable in terms of cost for reproducing the lower sound spectrum.

In FIG. 1, if a horn (not shown) is attached to the opening portion of the passive radiator C, the radiating sound energy can be effectively diffused in a certain direction to establish directionality of sound emission. As a result, the lower sound spectrum can be further strengthened. In the rear window tray or shelf of the automobile, however, it is extremely difficult to attach the horn to establish this effect because of the above noted positional or shelf restriction.

SUMMARY OF THE INVENTION

Accordingly, an object of this invention is to provide a speaker system provided with a passive radiator in the interior thereof so that the lower frequency reproducing range of the speaker system can be broadened.

It is another object of this invention to provide an improved speaker structure for automobiles.

Yet another object of this invention is to provide for an improved automobile speaker that is low in cost yet highly efficient and compatible with modern automobile sound reproduction systems.

Briefly stated, according to this invention, due to the fact that the rear glass of a vehicle is inclined the radiating surface of the passive radiator is positional to face the rear glass to thereby produce a horn effect. Due to the horn effect, the lower frequency reproduction range is broadened.

DETAILED DESCRIPTION OF THE PREFERRED EMBODIMENT

A preferred embodiment according to this invention will now be described with reference to the accompanying drawings.

Figure 1:
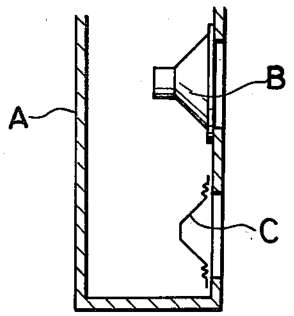
FIG. 1 PRIOR ART
FIG. 1 is a sectional view showing a conventional speaker cabinet provided with a passive radiator.
Figure 2:
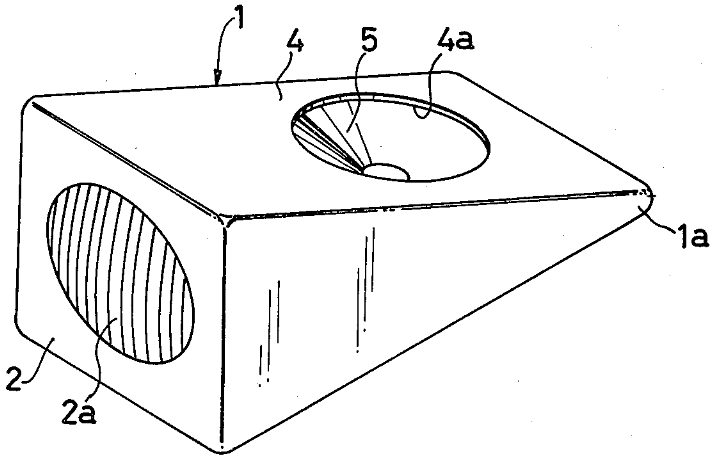
FIG. 2 is a perspective view showing a speaker system to be mounted in a vehicle according to this invention.
Figure 3:
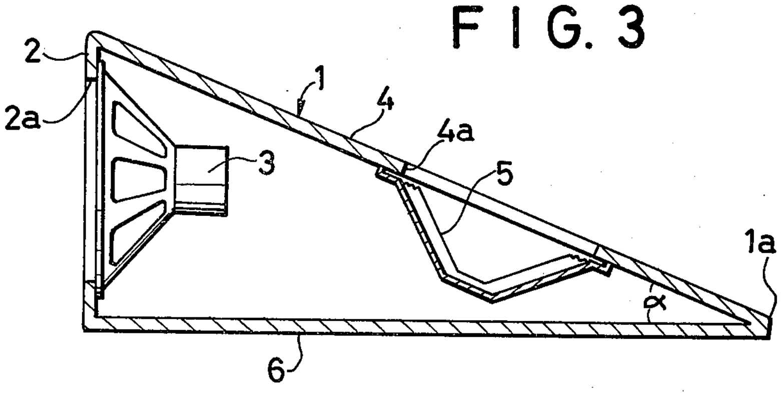
FIG. 3 is a longtitudinal sectional view of the speaker system shown in FIG. 2.
Figure 4:
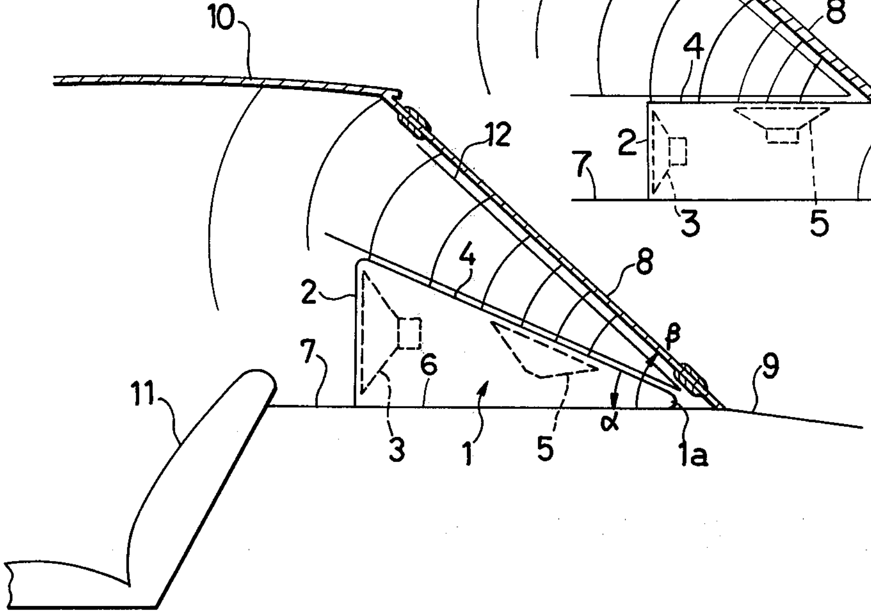
FIG. 4 is a sectional view showing the condition where the speaker system according to this invention is mounted in the vehicle.

In FIGS. 2 through 4, reference numeral 1 designates a speaker cabinet having a front board or wall 2 to which a speaker unit 3 is attached. An opening 2*a* is on the front board 2, and a top wall or ceiling board 4 slopes downward from the front board 2 to a rear part 1*a* of the speaker cabinet 1. As shown, the ceiling board 4 has an opening portion 4*a* . A passive radiator (or drone cone) 5 is attached to the opening portion 4*a* from the interior of the speaker cabinet 1.

Figure 6:
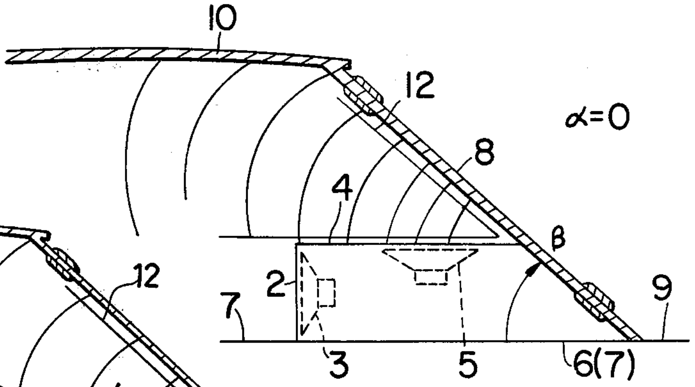
FIG. 6 is a sectional view showing an embodiment of the speaker system of the present invention in which the ceiling board of the speaker cabinet is installed parallel to the surface of the rear window tray of the vehicle in which the speaker system is mounted.

In order to obtain a horn effect, it is necessary that the acute angle $\alpha$ of the ceiling board 4 with respect to a bottom board or wall 6 of the speaker cabinet 1 should be made smaller than the angle $\beta$ formed by the rear window 8 of an automobile with respect to a rear shelf or tray 7 thereof. This is shown in FIG. 4 where $\beta$ is greater than $\alpha$. The ceiling board 4, however, need not be inclined but it may be installed to be in parallel to the surface of the rear tray 7 when the speaker cabinet 1 is positioned on the rear tray of the automobile. This embodiment of the speaker system of the present invention is shown in FIG. 6. In FIG. 4, reference numeral 9 designates a rear deck of the automobile; 10 is the roof thereof; and 11 a seat back of the automobile.

As shown therein, if the speaker cabinet 1 is positioned on the rear window tray or shelf 7 in such a manner that the rear part 1*a* of the speaker cabinet 1 is in the rearmost position of the rear tray 7, due to the difference in the acute angles $\alpha$ and $\beta$ between the ceiling board and the rear window 8, horn region 12 is formed therebetween. Hence the divergent opening of the horn region 12 faces the front side of the automobile and the passive radiator 5 is situated in the throat portion of that horn region. Consequently, the radiating sound of the passive radiator 5 is propagated through the horn region 12 to the front side of the automobile.

Figure 5:
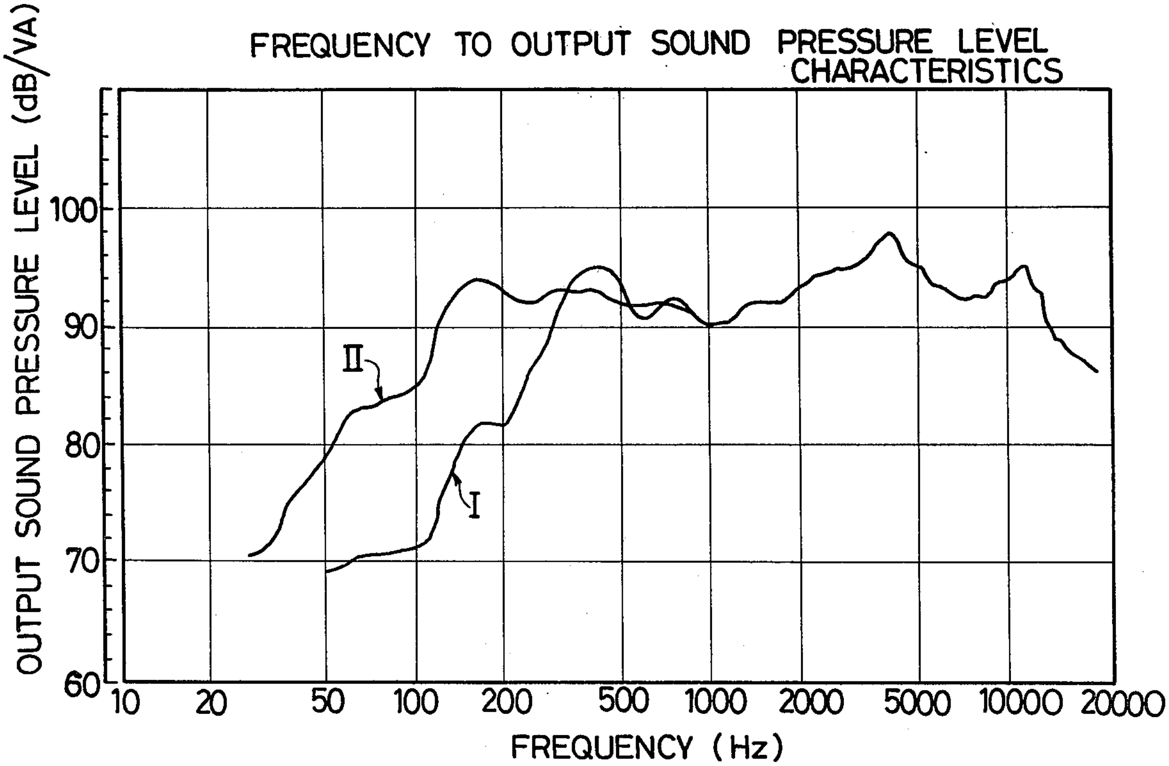
FIG. 5 is a graphical indication showing frequency to output sound pressure level characteristics according to a conventional and the present speaker system.

As can be appreciated from the graph, FIG. 5, the frequency to output sound pressure level characteristic II of the speaker system according to this invention is superior to the characteristic I of the conventional speaker system. This is practically true in the lower frequency reproducing region which is significantly broadened. In order to enhance the horn effect owing to the horn region 12, it is preferable that the passive radiator 5 be provided as close as possible to the rear part 1*a* of the speaker cabinet 1.

As described, according to this invention, the radiating surface of the passive radiator confronts the rear glass of the automobile so as to produce a horn effect. As a result the lower frequency reproducing region can be broadened due to the position of the passive radiator 5 and the horn effect even if the inner volume of the speaker cabinet is maintained rather small.

What is claimed is:

1. In a speaker system adapted to be mounted in a vehicle adjacent the vehicle's rear window which is inclined upwardly toward the front of the vehicle, said speaker system having an active speaker unit and a passive speaker unit mounted in a housing, the improvement comprising means for mounting said passive speaker unit in said housing to face said rear window so that said rear window and the top wall of said housing form an acoustical horn directing the sound from said passive speaker unit toward the front of said vehicle.

2. The speaker system of claim 1 wherein said housing is generally wedge shaped and said top wall thereof is downwardly sloping toward the rear of the vehicle, and wherein said passive speaker unit is mounted on said downwardly sloping top wall.

3. The speaker system of claims 1 or 2 wherein said active speaker system faces into said vehicle away from said rear window.

4. The speaker system of claims 1 or 2 wherein said vehicle has a rear window shelf, and said housing is mounted on said rear shelf.

5. The speaker system of claim 4 wherein said shelf and said rear window define an acute angle $\beta$, said shelf and said downward sloping top wall define an acute angle $\alpha$, and wherein $\beta$ is greater than $\alpha$.

6. The speaker system of claim 1 wherein the vehicle has a rear window shelf, and wherein said top wall of said housing is substantially parallel to said rear shelf.

7. The speaker system of claim 1 wherein said housing also has a front wall in which said active speaker unit is mounted and a bottom wall mounted on said rear window shelf, said top wall is inclined downwardly toward the rear of the vehicle, and wherein said passive speaker unit is mounted at the rear portion of said downwardly inclined top wall.

8. The speaker system of claim 7 wherein said shelf and said rear window define an acute angle $\beta$, said shelf and said top wall define an acute angle $\alpha$, and wherein $\beta$ is greater than $\alpha$.

* * * * *